United States Patent [19]

Milligan

[11] Patent Number: 5,227,244
[45] Date of Patent: Jul. 13, 1993

[54] POLYIMIDE FILM WITH METAL SALT COATING RESULTING IN IMPROVED ADHESION

[75] Inventor: Stuart N. Milligan, Circleville, Ohio

[73] Assignee: E. I. Du Pont de Nemours and Company, Wilmington, Del.

[21] Appl. No.: 845,759

[22] Filed: Mar. 3, 1992

Related U.S. Application Data

[63] Continuation of Ser. No. 586,620, Sep. 21, 1990, abandoned.

[51] Int. Cl.$^5$ .............................................. B32B 27/06
[52] U.S. Cl. ................................. 428/458; 428/473.5
[58] Field of Search ............... 428/458, 469, 473.5; 524/401, 403, 413

[56] References Cited

U.S. PATENT DOCUMENTS

| | | | |
|---|---|---|---|
| 3,375,131 | 3/1968 | Schmidt | 428/473.5 |
| 3,389,111 | 6/1968 | McKeown et al. | 260/30.2 |
| 4,742,099 | 5/1988 | Nagano et al. | 524/115 |
| 4,755,424 | 7/1988 | Takeoka et al. | 428/323 |
| 4,797,307 | 1/1989 | Kunimoto et al. | 427/386 |
| 4,861,663 | 8/1989 | Sirinyan et al. | 428/409 |
| 4,931,365 | 6/1990 | Inoue et al. | 428/458 |

FOREIGN PATENT DOCUMENTS 0257274  7/1987  European Pat. Off. .

Primary Examiner—Paul J. Thibodeau
Assistant Examiner—D. S. Nakarani

[57] ABSTRACT

A polyimide film is described having improved adhesion prepared by coating the surface of a partially cured or partially dried polyamide acid film with an organic solvent solution of a metal salt and heating the coated film to both convert the polyamide acid to polyimide and dry the film. By proper selection of the metal salt either a one-side adherable or two-side adherable polyimide film can be obtained. The polyimide film can be used in electrical insulating and flexible printed circuit applications where superior adhesion is an important requirement.

12 Claims, No Drawings

POLYIMIDE FILM WITH METAL SALT COATING RESULTING IN IMPROVED ADHESION

This is a continuation of application Ser. No. 07/586,620 filed Sep. 21, 1990, now abandoned.

BACKGROUND OF THE INVENTION

The present invention relates to a polyimide film having improved adhesion prepared by coating the surface of a partially cured or partially dried polyamide acid film with a solution of a specified metal salt and then heating the coated film to imidize the polyamide acid to the polyimide as well as to dry the film.

Polyimide film is well-known for its outstanding properties such as heat resistance, low temperature resistance, chemical resistance, electrical insulation and mechanical strength. Such polyimide film is widely used as an electrical insulating film and as a base for flexible printed circuits. In such applications, the polyimide film is usually bonded to a copper foil with an acrylic or epoxy adhesive and, therefore, good adhesion is an important property requirement.

U.S. Pat. No. 4,742,099, issued to Nagano et al., on May 3, 1988, discloses a polyimide film containing from 30 to 800 ppm of a titanium-based organometallic compound for improving adhesion. The polyimide film of the invention does not contain an organometallic titanium compound.

U.S. Pat. No. 3,389,111, issued to McKeown et al., on Jun. 18, 1968, discloses polyimide films having improved corona resistance containing organo-metallic compounds of Groups IVb and Vb of the Periodic Table. The polyimide film of the invention does not contain Group IVb or Vb organometallic compounds.

U.S. Pat. No. 4,797,307, issued to Kunimoto et al., on Jan. 10, 1989, discloses a polyimide film having improved adhesiveness prepared by coating the surface of the film with a heat-resistant aminosilane, epoxysilane or titanate treating agent. The polyimide film of this invention is not coated with an aminosilane, epoxysilane or titanate treating agent.

An object of the present invention is to provide a polyimide film which has improved surface adhesiveness.

More particularly, the invention provides a polyimide film which has improved surface adhesion when bonded to metal foils, such as copper foil, by means of an epoxy, acrylic or other heat-resistant resin adhesive.

SUMMARY OF THE INVENTION

According to the present invention there is provided a polyimide film having a surface adhesion of at least 8 pli on one or both sides (in accordance with IPC Method 2.4.9 Revision C) comprising a polyimide base film coated with an organic solvent solution containing from 0.1 to 10 weight % of a metal salt wherein the metal is selected from the group consisting of Sn, Cu, Zn, Fe, Co, Mn and Pd.

The metal salt can be applied to either a partially cured or a partially dried solid polyamide acid film as a solution in an organic solvent such as dimethylacetamide. The coated base film is then heated to both dry the film and completely convert the polyamide acid to polyimide.

By proper choice of the metal salt, either a one-side adherable or two-side adherable polyimide film can be obtained. Metal salts having a strongly basic counterion with a pka greater than 5.8 generally provide a one-side adherable film, whereas metal salts having a weakly basic counterion with a pka less than 5.8 generally provide a two-side adherable film.

DETAILED DESCRIPTION OF THE INVENTION

The polyimide base films used in this invention can be made generally as disclosed in U.S. Pat. Nos. 3,179,630 and 3,179,634, the disclosures of which are hereby incorporated by reference. Polyamide acids are made by dissolving substantially equimolar amounts of at least one aromatic dianhydride and at least one diamine in a solvent and agitating the resulting solution under controlled temperature conditions until polymerization of the dianhydride and the diamine is completed.

Suitable dianhydrides for use in the polyimides include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3'4,4'-benzophenone tetracarboxylic dianhydride; 2,2-bis(3,4-dicarboxyphenyl) propane dianhydride; 3,4,9,10-perylene tetracarboxylic dianhydride; bis(3,4-dicarboxyphenyl) propane dianhydride; 1,1-bis(2,3-dicarboxyphenyl) ethane dianhydride; 1,1-bis(3,4-dicarboxyphenyl) ethane dianhydride; bis(2,3-dicarboxyphenyl) methane dianhydride; bis(3,4-dicarboxyphenyl) methane dianhydride; oxydiphthalic dianhydride; bis(3,4-dicarboxyphenyl) sulfone dianhydride; and the like.

Suitable diamines for use in the polyimides include: 4,4'-diaminodiphenyl propane; 4,4'-diamino diphenyl methane; benzidine; 3,3'-dichlorobenzidine; 4,4'-diamino diphenyl sulfide; 3,3'-diamino diphenyl sulfone; 4,4'-diamino diphenyl sulfone; 4,4'-diamino diphenyl ether; 1,5-diamino naphthalene; 4,4'-diamino diphenyl diethylsilane; 4,4'-diamino diphenylsilane; 4,4'-diamino diphenyl ethyl phosphine oxide; 4,4'-diamino diphenyl N-methyl amine; 4,4'-diamino diphenyl N-phenyl amine; 1,4-diaminobenzene (p-phenylene diamine); 1,3-diaminobenzene; 1,2-diaminobenzene; and the like.

The preferred polyimide base film used in this invention is derived from 4,4'-diaminodiphenyl ether and pyromellitic dianhydride.

Copolyimides derived from any of the above diamines and dianhydrides are also operable. Particularly preferred copolyimides are those derived from 15 to 85 mole % of biphenyltetracarboxylic dianhydride, 15 to 85 mole % pyromellitic dianhydride, 30 to 100 mole % p-phenylenediamine and 0 to 70 mole % of 4,4'-diaminodiphenyl ether. Such copolyimides are described in U.S. Pat. No. 4,778,872 which disclosure is also incorporated herein by reference.

The solvent must dissolve one or both of the polymerizing reactants and, preferably, will dissolve the polyamide acid polymerization product. The solvent must be substantially unreactive with all of the polymerizing reactants and with the polyamide acid polymerization product.

Preferred solvents include normally liquid N,N-dialkylcarboxylamides, generally. Preferred ones of those solvents include the lower molecular weight members of such carboxylamides, particularly N,N-dimethylformamide and N,N-diethylacetamide. Other solvents which may be used are dimethylsulfoxide, N-methyl-2-pyrrolidone, tetramethyl urea, dimethylsulfone, hexamethylphosphoramide, tetramethylene sulfone, and the like. The solvents can be used alone, in combinations with one another or in combinations with poor solvents such as benzene, benzonitrile, dioxane, etc. The amount of solvent used preferably ranges from 75 to 90 weight % of the polyamic acid, since this concentration has been found to give optimum molecular weight.

The polyamide acid solutions are generally made by dissolving the diamine in a dry solvent and slowly adding the dianhydride under conditions of agitation and controlled temperature in an inert atmosphere. The diamine is conveniently present as a 5 to 15 weight percent solution in the solvent and the diamine and dianhydride are usually used in about equimolar amounts.

The metal salt can be applied as a solution in an organic solvent to either a partially cured "gel film" or a solvated film of the polyamide acid. The term "gel film" means a sheet of the polyamide acid material which is laden with volatiles, primarily solvent, to such an extent that the polymeric material is in a gel-swollen, plasticized, rubbery condition. The base gel film thickness generally falls in the range of 2 to 25 mils. The volatile content is usually in the range of 80 to 90% by weight of the gel film. The gel film is self-supporting and partially and incompletely cured, i.e., is at an intermediate stage of curing from polyamide-acid to polyimide.

The gel film structure can be prepared by the method described in U.S. Pat. No. 3,410,826 by mixing a chemical coverting agent and a catalyst, such as a lower fatty acid anhydride and a tertiary amine, respectively, into the polyamide acid solution at a low temperature, followed by casting the polyamide acid solution in film form on a casting surface and then mildly heating at, for example, 100° C. to activate the conversion agent and catalyst for transforming the cast film to a polyamide acid-polyimide gel film.

The gel film is subsequently dried to remove the water, residual solvent, and remaining conversion chemicals, and the polyamide acid is completely converted to polyimide. The drying can be conducted at relatively mild conditions without complete conversion of polyamide acid to polyimide at that time, or the drying and conversion can be conducted at the same time using higher temperatures. Because the gel has so much converting steps, the gel must be restrained during drying to avoid undesired shrinkage. In continuous production, the film can be held at the edges, such as in a tenter frame using tenter clips or pins for restraint. A polyimide film which is permitted to shrink excessively during drying and conversion is brittle and lacks the superior performance characteristics expected of polyimide film materials.

Preferably, high temperatures are used for short times to dry the film and convert it to polyimide in the same step. It is preferred to heat the film to a temperature of 200°–550° C. for 15 to 400 seconds although 30–60 minutes at 300° C. can also be used. Of course, less heat and time are required for thin films than for thicker films. During this drying and converting, the film is restrained from undue shrinking and, in fact, can be stretched by as much as 200% of its initial dimension prior to completion of the drying and conversion. Stretching can be in any dimension. In film manufacture, stretching can be in either the longitudinal direction or the transverse direction. If desired, restraint can also be provided to permit some limited degree of shrinkage. Shrinkage of as much as 15% has been found to provide an adequate product.

The metal salt solution may also be applied to a solvated film of the polyamide acid, i.e., a film which is all polyamide acid or which has only a low polyimide content, say 0 to 25%, and which is about 50 to 75% by weight polymer and 25 to 50% by weight solvent. Such film is sufficiently strong to be self-supporting.

The solvated polyamide acid can be prepared by casting the polyamide acid solution on a casting surface and heating at a temperature above 50° C. to partially convert the polyamide acid to polyimide. The extent of polyamide acid conversion depends on the temperature employed and the time of exposure, but, generally about 25 to 95% of the amide acid groups are converted to imide groups. The partially converted polyamide acid is then heated at or above 220° C. to obtain complete conversion to the polyimide.

In accordance with the present invention, the metal salt solution is coated on either the partially cured polyamide acid gel film or the solvated film of the polyamide acid. Application of the coating can be accomplished in any number of ways, such as by dipping, wick-coating or kiss-roll coating, followed by metering with a doctor knife, doctor rolls, squeeze rolls or air knife. It may also be applied by brushing or spraying.

Using such techniques, it is possible to prepare both one- and two-side coated structures. In preparation of the two-side coated structures, the coatings can be applied to the two-sides either simultaneously or consecutively before going to the final curing and drying stage.

Metal salts having utility in the invention include those containing Sn, Zn, Cu, Fe, Co, Mn and Pd. Adhesion improvement is not dependent on the oxidation state of the metal cation. Operable counterions include, among others, chloride, bromide, iodide, acetate, acetylacetonate and formate. The salts may be anhydrous or hydrated and may contain neutral coordinated ligands such as phosphines, phosphites, phosphine oxides, amines, amine oxides, and others.

Two-side adherable film can be made by coating a solution of the metal salt containing weakly basic counterions, such as halides, onto the surface of a partially cured polyamide acid gel film or partially dried polyamide acid film. One-side adherable film can be made by coating a solution of metal salt containing very basic counterions, such as acetates or formates, onto the surface of partially cured or partially dried film.

Strongly basic counterions produce one-side adherable films by reacting with an acidic proton on polyamic acid segments of the partially cured or partially dried film. The carboxylate anion of the polyamic acid segment and the acid form of the counterion are formed. The metal ion then bonds to the carboxylate anion and is no longer mobile in the gel film solvent medium. It therefore stays at or near the coated side and improves adhesion only on that surface. The $pk_a$ of the polyamic acid is about 5.8. It is believed that counterions formed from acids weaker than the acid groups of the polyamic acid will exhibit one side adherable characteristics. Halides give two side adherable films because the corresponding acid is stronger than the carboxylic acid on the polymer chain.

On occasion, a metal will bind the counterion tightly enough so that the counterion does not react with the acidic proton. Coating such metal compounds onto partially cured or partially dried film gives a two side adherable film. Copper (II) acetate is an example of a metal compound which gives a two side adherable film despite having an acetate counterion.

The metal salts are coated from solutions having concentrations of metal salts ranging from 0.1 to 10% by weight of the organic solvent. Amounts of metal salt based on surface area less than 0.5 mg metal/ft$^2$ provide lower adhesion levels. Amounts of metal up to an upper limit of 20 mg metal/ft$^2$ may be used as long as other film properties remain acceptable.

Accordingly, the concentration based on the metal at the surface may range from 0.5 mg metal per sq ft of film to 20 mg metal per sq ft of film, preferably from 1 mg metal/ft$^2$ to 10 mg metal/ft$^2$, and most preferably 2 mg metal/ft$^2$ to 5 mg metal/ft$^2$.

The preferred metal is tin and the preferred metal salt is stannous chloride or, more preferably, stannous acetate which when used in a concentration of from 2 to 10 mg tin/ft$^2$ provides a peel strength of at least 10 pli when used in adhesively bonded polyimide copper laminates.

It is extremely important to have good adhesion of the polyimide base film to the copper foil in a laminate. Poor adhesion can result in poor processability during circuit manufacture. Poor adhesion can also result in detachment of copper lines under operating conditions in the final circuit rendering the circuit useless. The benefits of good adhesion are improved manufacturing yields and better functionality of the flexible printed circuit.

The advantageous properties of this invention can be observed by reference to the following examples which illustrate, but do not limit, the invention. All parts and percentages are by weight unless otherwise indicated.

EXAMPLE 1

Comparison Examples 1C and 2C

Control Film

A 20.3% solids solution of PMDA/ODA polyamic acid (30.0 g) was thoroughly mixed with DMAc (12.7 ml) and cooled to about 0° C. in an ice/water bath. Acetic anhydride (3.6 ml) was thoroughly mixed into the solution followed by beta-picoline (3.7 ml) which was also thoroughly mixed into the solution. The solution was centrifuged to remove the air bubbles and then cast onto a glass plate using a stainless steel rod supported at a fixed height above the glass plate surface by adhesive tape. The glass plate and film were heated on a hot plate at about 90° C. for 5 minutes before being removed from the heat and cooled. The partially imidized film was stripped from the glass plate and restrained on a frame. The film was cured by placing the frame and film into a forced air oven for 20 minutes at 250° C. The film and frame were removed from the heat and cooled. The film was further cured in the frame at 400° C. for 5 minutes before removing from the frame.

EXAMPLE 1

A chemically converted film was prepared as described above. However, after the glass plate and film had been heated on a hot plate for 2.5 minutes, the film was coated using a paint brush with a 1% solution of stannous acetate in DMAc. After the film had been on the hot plate for a total of 5 minutes, it was removed from the heat, cooled, stripped from the glass plate, restrained on a frame, and cured as described for the control film. The resulting film had improved adhesion only on the coated (air) side but not on the uncoated (casting) side.

Two-sided copper laminates were prepared by laminating samples of the control polyimide film and the stannous acetate coated polyimide film with acrylic sheet adhesive and copper foil using heat and pressure. Laminates were made by pressing for 40 minutes at 177° C. and about 100 psi followed by 20 minutes cooling in the press at about 100 psi without heating.

Laminates were cut into strips (0.5 inch wide) using a Thwing-Albert precision cutter and the 90° peel strength measured on an Instron tester fitted with a German Wheel following IPC method 2.4.9 Revision C for determining laminate adhesion employing Pyralux ® W. A. Adhesive.

Adhesion results are given in Table I.

Comparison Example 1C

The same basic procedure as in Example 1 was followed except the partially imidized film was coated with a 1% solution of TYZOR ® DC titanate instead of stannous acetate. The resulting film showed no adhesion improvement on either the coated (air) or uncoated (casting) side compared to the control film. The adhesion results are shown in Table I.

Comparative Example 2 C

The same basic procedure as in Example 1 was followed except the partially imidized film was coated with a 1% solution of PROSIL ® 9214 silane adhesion promoter in DMAc instead of stannous acetate. The resulting film showed no adhesion improvement on either the coated (air) or uncoated (casting) side compared to a control film. The adhesion results are shown in Table 1.

EXAMPLE 2

The same basic procedure as in Example 1 was followed except the partially imidized film was coated with a 1% solution of SnCl$_4$ 2TPPO (TPPO=triphenylphosphine oxide) in DMAc instead of stannous acetate. The resulting film had improved adhesion on both the coated (air) side and the uncoated (casting) side. The adhesion results are shown in Table I.

EXAMPLE 3

The same basic procedure as in Example 1 was followed except the partially imidized film was coated with a 1% solution of cupric acetate in DMAc instead of stannous acetate. The resulting film had improved adhesion on both the coated (air) and the uncoated (casting) side presumably due to the copper binding the acetate counterion more tightly than tin. The adhesion results are shown in Table 1.

EXAMPLE 4

Control Film 20.3% solids solution of PMDA/ODA polyamic acid (30.0 g) was thoroughly mixed with DMAc (20 ml) and centrifuged to remove air bubbles. The solution was cast into a film on a glass plate using a stainless steel rod supported at a fixed height above the glass plate surface by adhesive tape. The glass plate and film were heated on a hot plate for 20 minutes at a temperature of about 90° C. At the end of the 20 minutes, the glass plate and film were removed from the heat and cooled. The partially dried film was then stripped from the glass plate and restrained on a frame. The film was cured by placing the frame and film into a forced air oven for 30 minutes while increasing the temperature from 160° C.

to 250° C. The film and frame were removed from the heat and cooled. The film was further cured in the frame at 400° C. for 5 minutes before being removed from the frame.

EXAMPLE 4

A thermally converted film was prepared as previously described above. However, after 20 minutes on the hot plate, the glass plate and film were removed from the heat and cooled. The partially dried film was coated with a 1% solution of $FeCl_3.6H_2O$ in DMAc using a paint brush. The glass plate and film were returned to the hot plate for another 5 minutes of heating. The film was then removed from the heat, cooled, stripped from the glass plate, restrained on a frame, and cured as described above.

Two-sided copper laminates were made as described in Example 1. The coated polyimide film had improved adhesion on both the coated (air) side and the uncoated (casting) side when compared to the control film. Adhesion results are given in Table I.

EXAMPLE 5

The same basic procedure as in Example 4 was followed except the partially dried film was coated with a 1% solution of palladium (II) chloride in DMAc instead of ferric chloride hexahydrate. The film was heated 30 minutes at 300° C. to complete the cure instead of 5 minutes at 400° C. The coated polyimide film had improved adhesion on both the coated (air) side and the uncoated (casting) side. The adhesion results are shown in Table 1.

TABLE 1

PEEL STRENGTHS OF METAL COMPOUND COATED POLYIMIDE FILMS AND UNCOATED POLYIMIDE CONTROL FILMS

| Example No. | Metal Compound | Concentration ($mg/ft^2$) | | Peel Strength (pli) | |
|---|---|---|---|---|---|
| | | Compound | Metal | Casting Side | Air Side |
| Control[a] | — | — | — | 1.7 | 1.8 |
| 1 | $Sn(C_2H_3O_2)_2$ | 10 | 5 | 2.5 | 13.1 |
| 1C | TYZOR ® DC | 10 | 1 | 5.3 | 3.8 |
| 2C | PROSIL ® 9214 | 10 | No Metal | 4.3 | 4.6 |
| 2 | $SnCl_4.2TPPO$ | 10 | 1 | 12.8 | 10.0 |
| 3 | $Cu(C_2H_3O_2)_2$ | 10 | 3 | 11.9 | 11.8 |
| Control[b] | — | — | — | 1.7 | 0.9 |
| 4 | $FeCl_3.6H_2O$ | 10 | 2 | 13.2 | 9.4 |
| 5 | $PdCl_2$ | 10 | 6 | 12.9 | 12.8 |

[a] = Chemical converted polyimide film
[b] = Thermally converted polyimide film

What is claimed is:

1. A polyimide film having improved surface adhesion to acrylic adhesive coated copper foil of at least 8 pli peel strength according to IPC Method 2.4.9 Revision C on one or both sides consisting essentially of a polyimide base film coated with an organic solvent solution consisting of from 0.1 to 10 weight % of a metal salt wherein the metal is selected from the group consisting of Sn, Cu, Zn, Fe, Co, Mn, and Pd wherein the organic solvent solution of the metal salt is coated onto a partially cured or partially dried polyamide acid base film and then heating the coated base film to both dry and completely convert the polyamide acid to polyimide.

2. The polyimide film of claim 1 wherein the base film has adhesion on both sides and is coated on both sides with a solution of a metal salt containing a weakly basic counterion having $pk_a$ value less than about 5.8.

3. The polyimide film of claim 2 wherein the counterion is chloride.

4. The polyimide film of claim 3 wherein the metal salt is ferric chloride.

5. The polyimide film of claim 3 wherein the metal salt is stannic chloride.

6. The polyimide film of claim 3 wherein the metal salt is stannous chloride.

7. The polyimide film of claim 1 wherein the base film has adhesion on one side and is coated with a solution of metal salt containing a very basic counterion with a $pk_a$ value greater than about 5.8.

8. The polyimide film of claim 7 wherein the metal salt is stannous acetate.

9. The polyimide film of claim 1 wherein the base film is derived from pyromellitic dianhydride and 4,4'-diaminodiphenyl ether.

10. The polyimide film of claim 1 wherein the organic solvent is dimethyl acetamide.

11. The polyimide film of claim 1 wherein the concentration of the metal at the surface of the polyimide film ranges from 0.5 mg metal to 20 mg metal per square foot of film.

12. The polyimide film of claim 1 wherein the metal is tin, and the concentration of tin at the surface of the polyimide film ranges from 2 to 10 mg of tin per square foot.

* * * * *